(12) United States Patent
Wang et al.

(10) Patent No.: US 8,736,578 B2
(45) Date of Patent: May 27, 2014

(54) SENSING CIRCUIT AND METHOD FOR A CAPACITIVE TOUCH PANEL

(71) Applicant: Elan Microelectronics Corp., Hsinchu (TW)

(72) Inventors: Tsun-Min Wang, Changhua (TW); Chun-Yu Lin, Taichung (TW); Te-Sheng Chiu, Taichung (TW); Chun-Chung Huang, Hsinchu (TW)

(73) Assignee: Elan Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/801,702

(22) Filed: Mar. 13, 2013

(65) Prior Publication Data

US 2013/0194234 A1 Aug. 1, 2013

Related U.S. Application Data

(63) Continuation of application No. 12/652,260, filed on Jan. 5, 2010, now Pat. No. 8,593,429.

(30) Foreign Application Priority Data

Jan. 9, 2009 (TW) .................. 98100727 A
May 25, 2009 (TW) .................. 98117362 A

(51) Int. Cl.
*G06F 3/045* (2006.01)
(52) U.S. Cl.
USPC ........................................ 345/174

(58) Field of Classification Search
USPC ............................ 345/174; 178/18.06; 341/33
See application file for complete search history.

(56) References Cited

U.S. PATENT DOCUMENTS

| | | | |
|---|---|---|---|
| 5,189,417 A | 2/1993 | Caldwell et al. | |
| 5,659,257 A | 8/1997 | Lu et al. | |
| 2009/0009186 A1 | 1/2009 | Kaneko | |
| 2009/0167718 A1 | 7/2009 | Lee et al. | |
| 2009/0284495 A1* | 11/2009 | Geaghan et al. | 345/174 |

* cited by examiner

*Primary Examiner* — Allison W Johnson
(74) *Attorney, Agent, or Firm* — Muncy, Geissler, Olds & Lowe, P.C.

(57) ABSTRACT

A sensing method and circuit for a capacitive touch panel sense the capacitance variation of a lateral capacitor formed at the intersection of two traces of the capacitive touch panel, to distinguish a real point from a ghost point. A sensing cycle includes two non-overlapping clock phases. In the first clock phase, the voltages across the lateral capacitor and across a sensing capacitor are set. In the second clock phase, the voltage at a first terminal of the lateral capacitor is changed, and a second terminal of the lateral capacitor is connected to a first terminal of the sensing capacitor, causing a voltage variation at a second terminal of the sensing capacitor. This voltage variation is used to determine whether the intersection is touched. The sensing method and circuit reflect the status of the lateral capacitor in real-time and prevent the location of the touch point from being misjudged.

13 Claims, 20 Drawing Sheets

SENSING CIRCUIT AND METHOD FOR A CAPACITIVE TOUCH PANEL

CROSS REFERENCE TO RELATED APPLICATIONS

This application is a Continuation of co-pending application Ser. No. 12/652,260, filed on Jan. 5, 2010, for which priority is claimed under 35 U.S.C. §120; and this application claims priority of Application No. 098100727 filed in Taiwan on Jan. 9, 2009 under 35 U.S.C. §119; and Application No. 098117362 filed in Taiwan on May 25, 2009 under 35 U.S.C. §119, the entire contents of all of which are hereby incorporated by reference.

FIELD OF THE INVENTION

The present invention is related generally to a capacitive touch panel and, more particularly, to a sensing circuit and method for a capacitive touch panel.

BACKGROUND OF THE INVENTION

As shown in FIG. 1, an XY-programmed capacitive touch panel 10 includes a plurality of X-direction traces TX1-TX8 and a plurality of Y-direction traces TY1-TY6, whose positioning method includes scanning the X-direction traces TX1-TX8 and the Y-direction traces TY1-TY6 to locate the touch point according to the capacitance variations in direction and Y-direction. For example, when a finger touches a point 12 on the capacitive touch panel 10, the capacitance values of the traces TXT and TY3 are changed, so it can be determined that the finger is at the intersection 12 of the traces TX8 and TY3. However, for multi-touch applications, this positioning method is unable to correctly identify the touch points. Taking a two-finger application as shown in FIG. 2 for an example, two fingers touching the capacitive touch panel 10 simultaneously at touch points 20 and 22 respectively, will cause the capacitance values of the traces TX2, TX4, TY2, and TY4 changed. In this case, there are two possible pairs of touch points according to the capacitance variations, in addition to the real touch points 20 and 22, i.e., the positions (TX2, TY4) and (TX4, TY2) where the fingers actually touch, two ghost points 24 and 26, i.e., the positions (TX2, TY2) and (TX4, TY4), are present, which will make the capacitive touch panel 10 unable to accurately identify the real touch points 20 and 22.

Therefore, it is desired a solution for a capacitive touch panel to distinguish real points from ghost points.

BRIEF SUMMARY OF THE INVENTION

An object of the present invention is to provide a sensing method and circuit for a capacitive touch panel.

Another object of the present invention is to provide a method and circuit for a capacitive touch panel to distinguish real points from ghost points.

According to the present invention, a sensing method for a capacitive touch panel includes applying a first voltage to a first trace and a second trace of the capacitive touch panel and setting the voltage across a sensing capacitor in a first clock phase, and switching the first trace being connected from the first voltage to a second voltage and connecting the second trace to a first terminal of the sensing capacitor in a second clock phase, thereby causing a voltage variation at a second terminal of the sensing capacitor.

According to the present invention, a sensing circuit for a capacitive touch panel includes a first switching circuit connected to a first trace of the capacitive touch panel to connect the first trace to a first voltage terminal in a first clock phase and to a second voltage terminal in a second clock phase, an operational amplifier having a first input connected to the first voltage terminal, a second input, and an output, a second switching circuit connected to a second trace of the capacitive touch panel to connect the second trace to the first voltage terminal in the first clock phase and to the second input of the operational amplifier in the second clock phase, a sensing capacitor having a first terminal connected to the second input of the operational amplifier, and a second terminal, a third switching circuit connected between the second input and the output of the operational amplifier to connect the output of the operational amplifier to the second input in the first clock phase, and a fourth switching circuit connected to the second terminal of the sensing capacitor to connect the second terminal of the sensing capacitor to the first voltage terminal in the first clock phase and to the output of the operational amplifier in the second clock phase.

According to the present invention, a sensing method for a capacitive touch panel includes in a first clock phase, applying a first voltage and a second voltage to a first trace and a second trace of the capacitive touch panel, respectively, and setting the voltage across a sensing capacitor, and in a second clock phase, switching, the first trace being connected from the first voltage to a third voltage and connecting the second trace to a first terminal of the sensing capacitor, thereby causing a voltage variation at a second terminal of the sensing capacitor.

According to the present invention, a sensing circuit for a capacitive touch panel includes a first switching circuit connected to a first trace of the capacitive touch panel to connect the first trace to a first voltage terminal in a first clock phase and to a second voltage terminal in a second clock phase, an operational amplifier having a first input connected to the second voltage terminal, a second input, and an output, a second switching circuit connected to a second trace of the capacitive touch panel to connect the second trace to the second voltage terminal in the first dock phase and to the second input of the operational amplifier in the second clock phase, a sensing capacitor having a first terminal connected to the second input of the operational amplifier, and a second terminal, a third switching circuit connected between the second input and the output of the operational amplifier to connect the output of the operational amplifier to the second input in the first clock phase, and a fourth switching circuit connected to the second terminal of the sensing capacitor and configured to connect the second terminal of the sensing capacitor to the second voltage terminal in the first clock phase and to the output of the operational amplifier in the second clock phase.

The sensing method and circuit according to the present invention are designed to sense the capacitance variation of a lateral capacitor formed at the intersection of two traces of a capacitive touch panel, so as to distinguish from real points and ghost points when the capacitive touch panel is touched.

BRIEF DESCRIPTION OF THE DRAWINGS

These and other objects, features and advantages of the present invention will become apparent to those skilled in the art upon consideration of the following description of the preferred embodiments according to the present invention taken in conjunction with the accompanying drawings, in which.

DETAILED DESCRIPTION OF THE INVENTION

Figure 2:
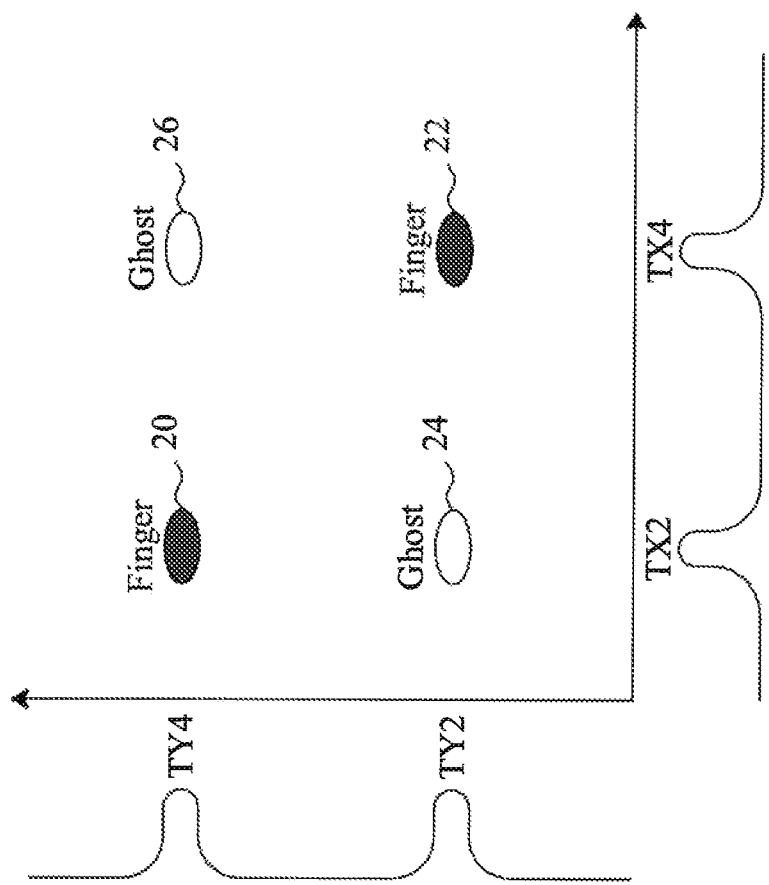
FIG. 2 is a schematic diagram showing a two-finger application.
Figure 3:
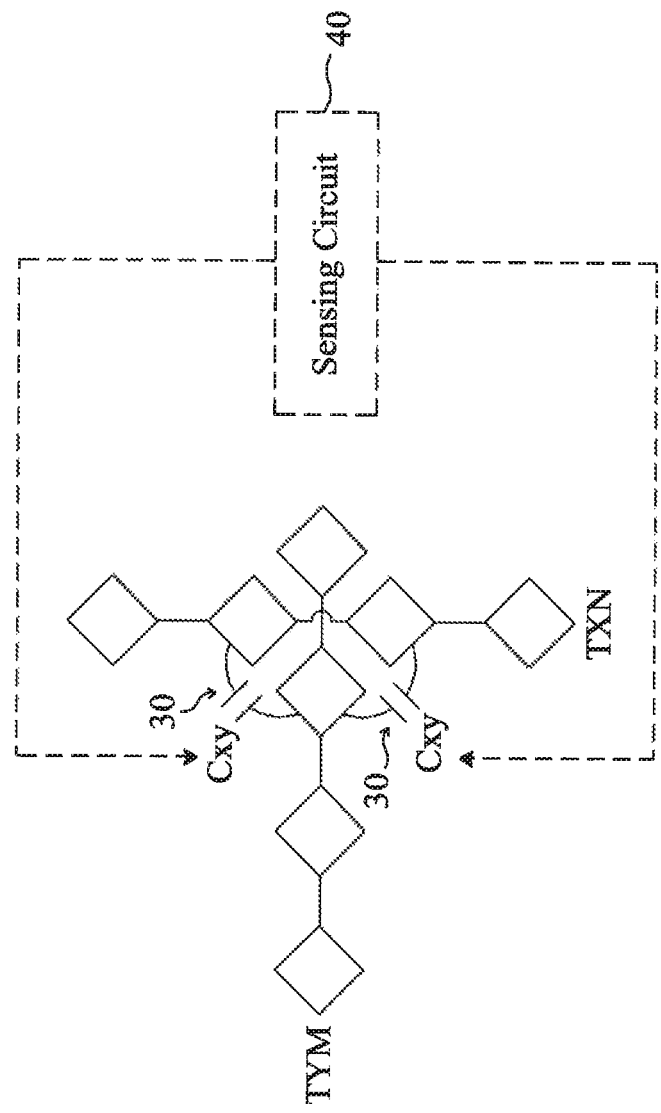
FIG. 3 is a schematic diagram showing the principle on which the present invention is based.

FIG. 3 is a schematic diagram showing the principle on which the present invention is based. At the intersection of two traces TXN and TYM of a capacitive touch panel, there will be a parasitic lateral capacitor 30 is formed between the two traces TXN and TYM, whose capacitance value is represented by Cxy. When a finger touches at the intersection of the traces TXN and TYM, not only are the capacitance values of the traces TXN and TYM changed, but also is the capacitance value Cxy of the lateral capacitor 30 changed. The capacitance variation of the lateral capacitor 30 can be used to identify a real point on the capacitive touch panel. For example, responsive to a two-finger touch as shown in FIG. 2, the lateral capacitance values of the real point (TX2, TY4) and (TM, TY2) are changed, whereas the lateral capacitance values of the ghost points (TX2, TY2) and (TX4, TY4) are not. Therefore, using a sensing circuit 40 to sense the lateral capacitance values can distinguish the real points from the ghost points according to the capacitance variations of the lateral capacitors.

Figure 4:
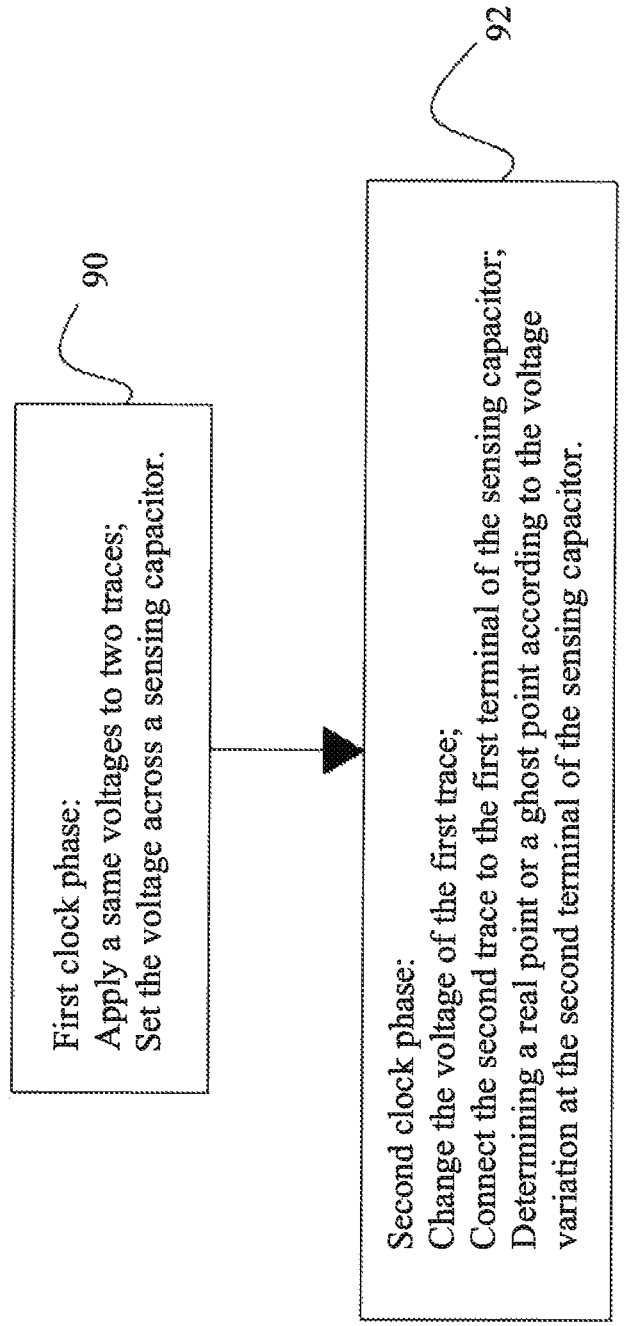
FIG. 4 is a flowchart of a sensing method according to the present invention.

FIG. 4 is a flowchart of a sensing method according to the present invention, in which a sensing cycle of the sensing circuit 40 for sensing the lateral capacitor 30 includes two clock phases. At step 90, in the first clock phase, the sensing circuit 40 applies a same voltage to the two traces TXN and TYM, and sets the voltage across a sensing capacitor thereof. To set the voltage across the sensing, capacitor, it may apply a same voltage or to different voltages to the two terminals of the sensing capacitor. For instance, the voltage applied to the traces TXN and TYM is also applied to the two terminals of the sensing capacitor. At step 92, i.e., in the second clock phase, the sensing circuit 40 changes the voltage of the trace TXN and connects the trace TYM to the first terminal of the sensing capacitor to cause the voltage at the second terminal of the sensing capacitor changed. This voltage variation at the second terminal of the sensing capacitor is related to the current capacitance value of the lateral capacitor 30 and can be used to determine whether the intersection is touched, thereby distinguishing a real point from a ghost point.

Figure 5:
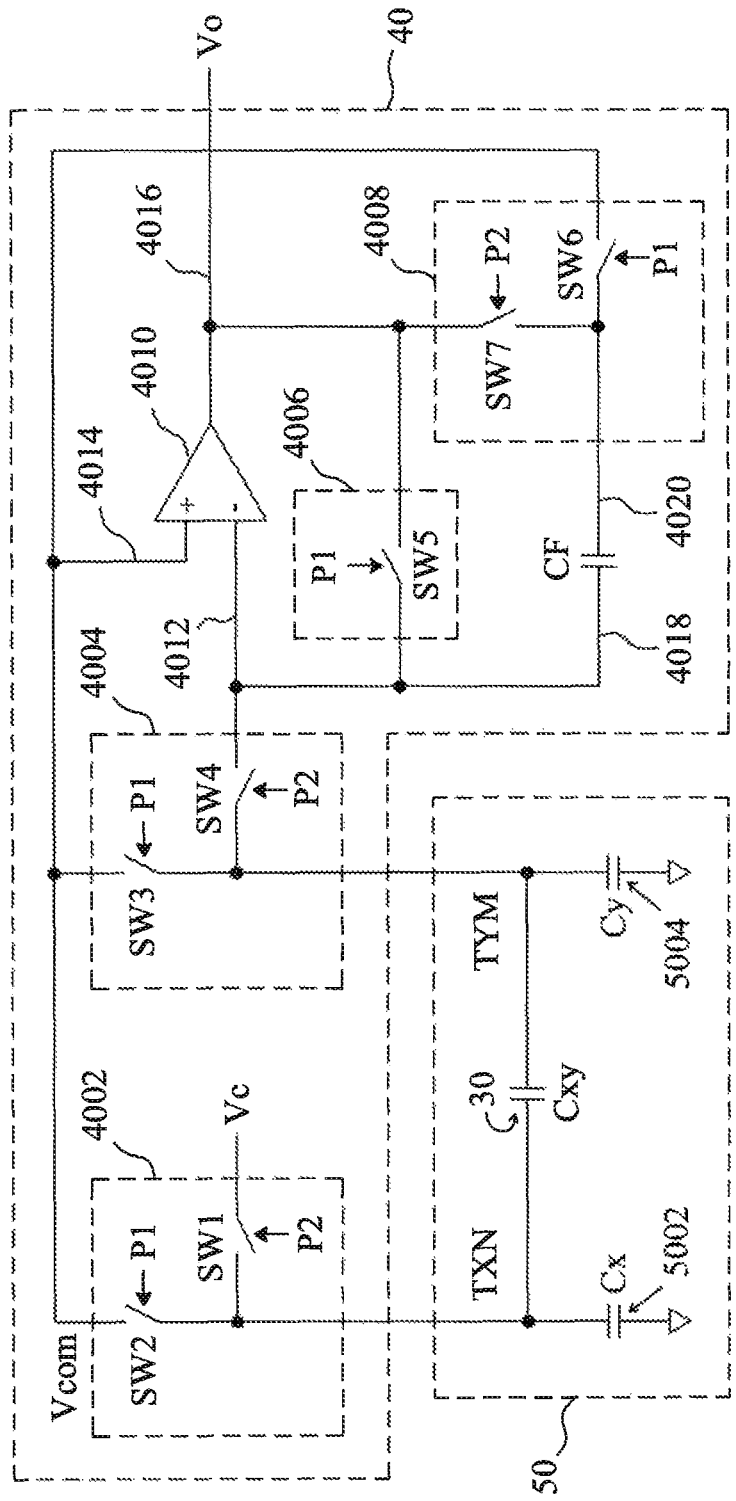
FIG. 5 is a circuit diagram of an embodiment for the sensing circuit according to the present invention.

FIG. 5 is a circuit diagram of an embodiment for the sensing circuit 40, in which the traces TXN and TYM of FIG. 3 are shown as an equivalent circuit 50, the trace TXN includes a self capacitor 5002 whose capacitance value is Cx, the trace TYM includes a self capacitor 5004 whose capacitance value is Cy, and the lateral capacitor 30 between the traces TXN and TYM has a capacitance value Cxy. The sensing circuit 40 is connected to the traces TXN and TYM and senses the capacitance variation of the lateral capacitor 30 to thereby determine whether the intersection of the traces TXN and TYM is touched by a finger. In the sensing circuit 40, a switching circuit 4002 includes a switch SW1 connected between a voltage terminal Vc and the trace TXN, and a switch SW2 connected between the trace TXN and a voltage terminal Vcom, and the switches SW1 and SW2 are controlled by clock phases P2 and P1, respectively. A switching circuit 4004 includes a switch SW3 connected between the trace TYM and the voltage terminal Vcom, and a switch SW4 connected between the trace TYM and an input 4012 of an operational amplifier 4010, and the switches SW3 and SW4 are controlled by the clock phases P1 and P2, respectively. The operational amplifier 4010 has another input 4014 connected to the voltage terminal Vcom. A switching circuit 4006 includes a switch SW5 connected between the input 4012 and an output 4016 of the operational amplifier 4010 and controlled by the clock phase P1. A sensing capacitor CF has a first terminal 4018 connected to the input 4012 of the operational amplifier 4010, and a second terminal 4020 connected to a switching circuit 4008. The switching circuit 4008 includes a switch SW6 connected between the second terminal 4020 of the sensing capacitor CF and the voltage terminal Vcom, and a switch SW7 connected between the second terminal 4020 of the sensing capacitor CF and the output 4016 of the operational amplifier 4010, and the switches SW6 and SW7 are controlled by the clock phases P1 and P2, respectively. The clock phases P1 and P2 do not overlap with each other.

Figure 6:
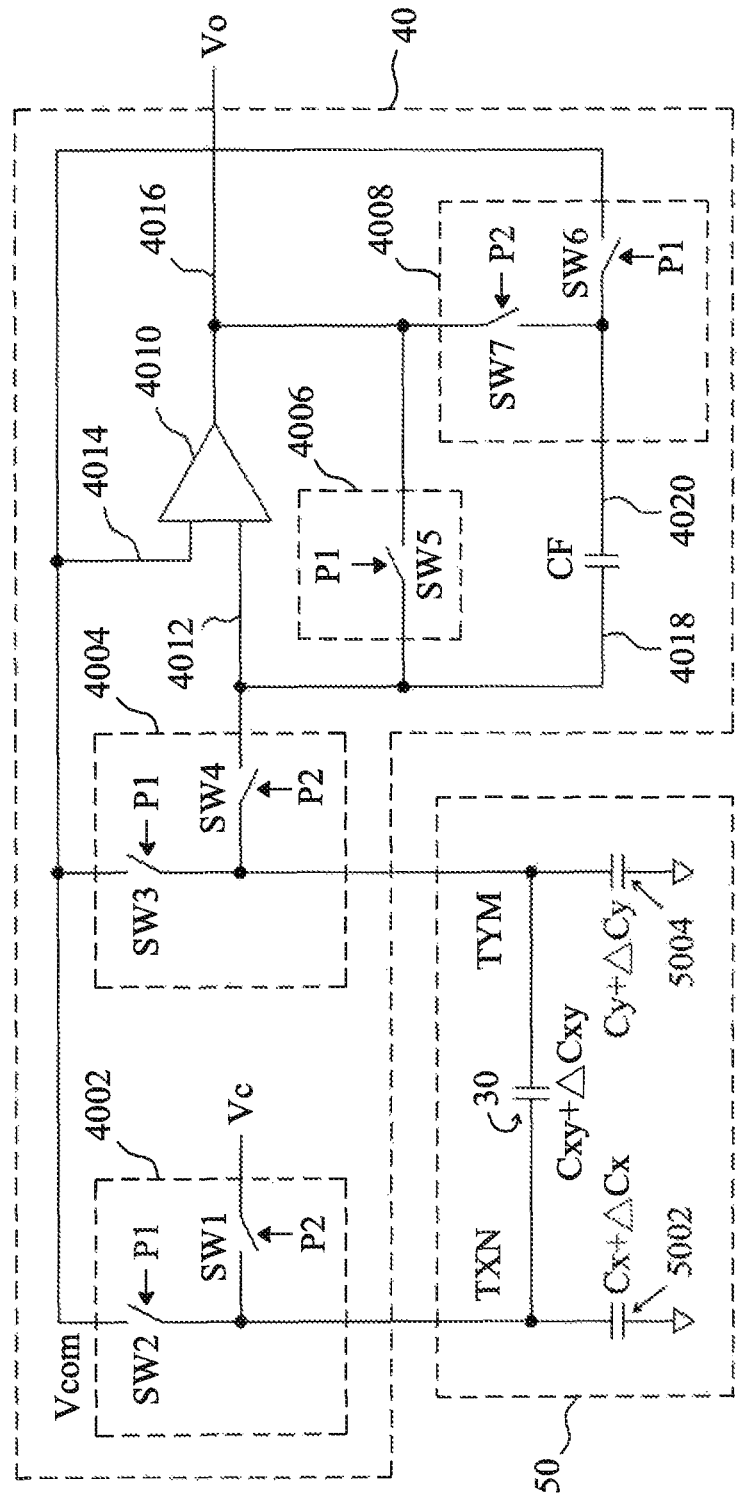
FIG. 6 is the circuit diagram of FIG. 5 when sensing a real point.
Figure 7:
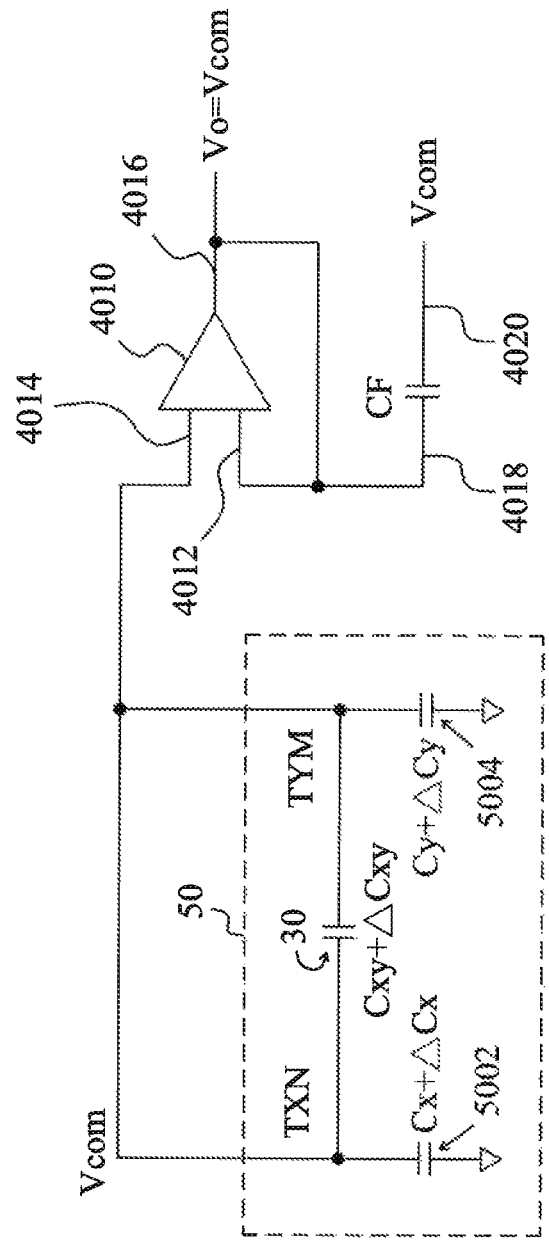
FIG. 7 is an equivalent circuit of FIG. 6 in a first clock phase.
Figure 8:
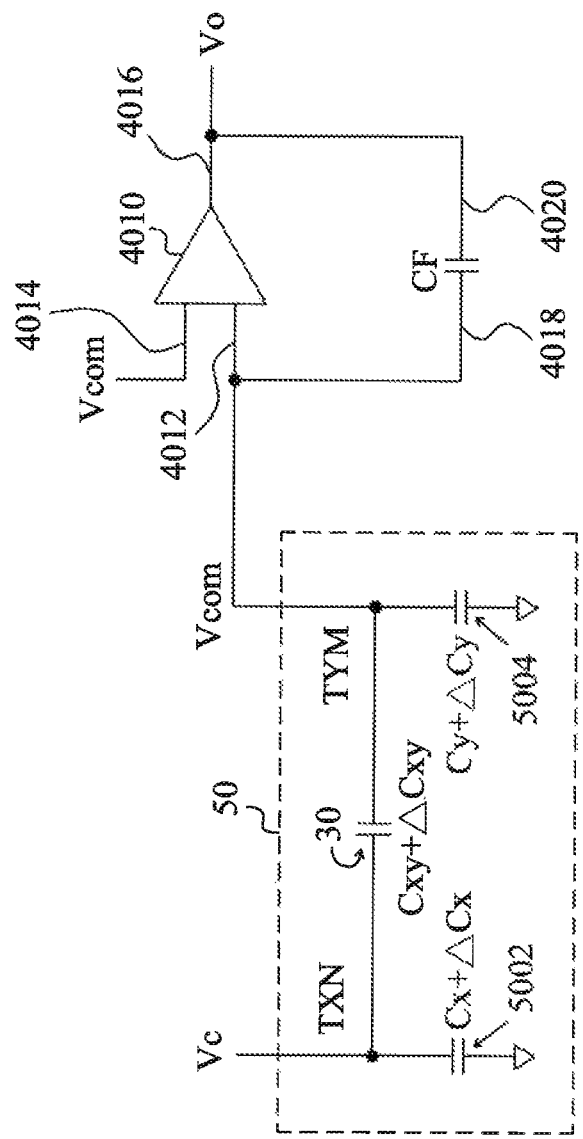
FIG. 8 is an equivalent circuit of Fig, 6 in a second clock phase.

FIG. 6 is the circuit diagram of FIG. 5 when a finger touches the intersection of the traces TXN and TYM, in which the self capacitors 5002 and 5004 of the traces TXN and TYM have increases in capacitance ΔCx and ΔCy, respectively, and the lateral capacitor 30 has an increase in capacitance ΔCxy. FIGS. 7 and FIGS. 8 are equivalent circuits of the sensing circuit 40 in the clock phases P1 and P2, respectively. Referring to FIG. 7, in the clock phase P1, the switches SW2, SW3, SW5 and SW6 are closed, and the switches SW1, SW4 and SW7 are opened. Consequently, the traces TXN and TYM are both connected to the voltage terminal Vcom, the second terminal 4020 of the sensing capacitor CF is connected to the voltage terminal Vcom, and the output 4016 of the operational amplifier 4010 is connected to the input 4012 of the operational amplifier 4010. As the self capacitor 5002 of the trace TXN has the capacitance increase ΔCx, the charge thereof is $$Qcx = Vcom \times (Cx + \Delta Cx). \qquad [\text{Eq-1}]$$

Similarly, as the self capacitor 5004 of the trace TYM has the capacitance increase ΔCy, the charge thereof is $$Qcy = Vcom \times (Cy + \Delta Cy). \qquad [\text{Eq-2}]$$

Since the two terminals of the lateral capacitor 30 are equal in voltage, the total charge of the lateral capacitor 30 is zero. In addition, due to the virtual short circuit, the voltage at the input 4012 of the operational amplifier 4010 is equal to the voltage Vcom at the input 4014. Therefore, the two terminals 4018 and 4020 of the sensing capacitor CF are equal in voltage, which leads to zero charge of the sensing capacitor CF, and the voltage Vo at the output 4016 of the operational amplifier 4010 is equal to Vcom. Afterward, in the clock phase P2, as shown in FIG. 8, the switches SW2, SW3, SW5 and SW6 are opened, and the switches SW1, SW4 and SW7 are closed. In consequence, the trace TXN is connected to the voltage terminal Vc, the trace TYM is connected to the input 4012 of the operational amplifier 4010, and the second terminal 4020 of the sensing capacitor CF is connected to the output 4016 of the operational amplifier 4010. Meanwhile, the output 4016 and the input 4012 of the operational amplifier 4010 are disconnected from each other. Under this circumstance, the charge of the self capacitor 5002 of the trace TXN is $$Qcx = Vcx(Cx + \Delta Cx), \qquad [\text{Eq-3}]$$

and the charge of the self capacitor 5004 of the trace TYM is $$Qcy = Vcom \times (Cy + \Delta Cy). \qquad [\text{Eq-4}]$$

Now that the TXN-side voltage of the lateral capacitor 30 has been switched from Vcom to Vc, and the TYM-side terminal of the lateral capacitor 30 is connected to the first terminal 4018 of the sensing capacitor CF, the charge of the lateral capacitor 30 is $$Qcxy = (Vc - Vcom) \times (Cxy + \Delta Cxy). \qquad [\text{Eq-5}]$$

Due to conservation of charge, a voltage variation occurs at the second terminal 4020 of the sensing capacitor CF. According to the equation Eq-5, the charge of the sensing capacitor CF is $$Qcf = (Vo - Vcom) \times CF = -(Vc - Vcom) \times (Cxy + \Delta Cxy). \qquad [\text{Eq-6}]$$

From the equation Eq-6, the voltage at the output 4016 of the operational amplifier 4010 is $$Vo = [-(Cxy - \Delta Cxy)/CF] \times (Vc - Vcom) + Vcom. \qquad [\text{Eq-7}]$$

It can be known from the equation Eq-7 that the capacitance variations ΔCx and ΔCy of the self capacitors 5002 and 5004 of the traces TXN and TYM do not affect the output Vo of the sensing circuit 40.

Figure 9:
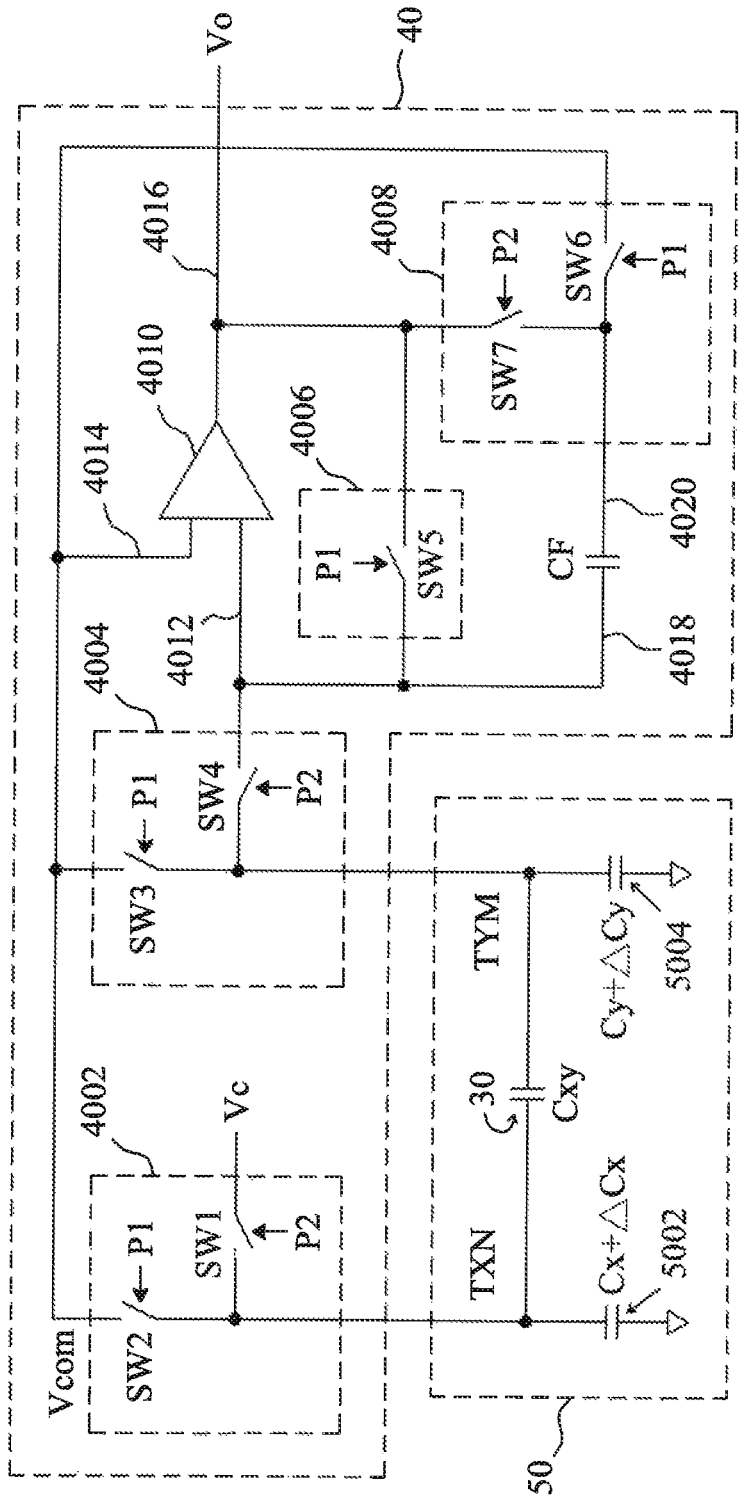
FIG. 9 is the circuit diagram of Fig, 5 when sensing a ghost point.
Figure 10:
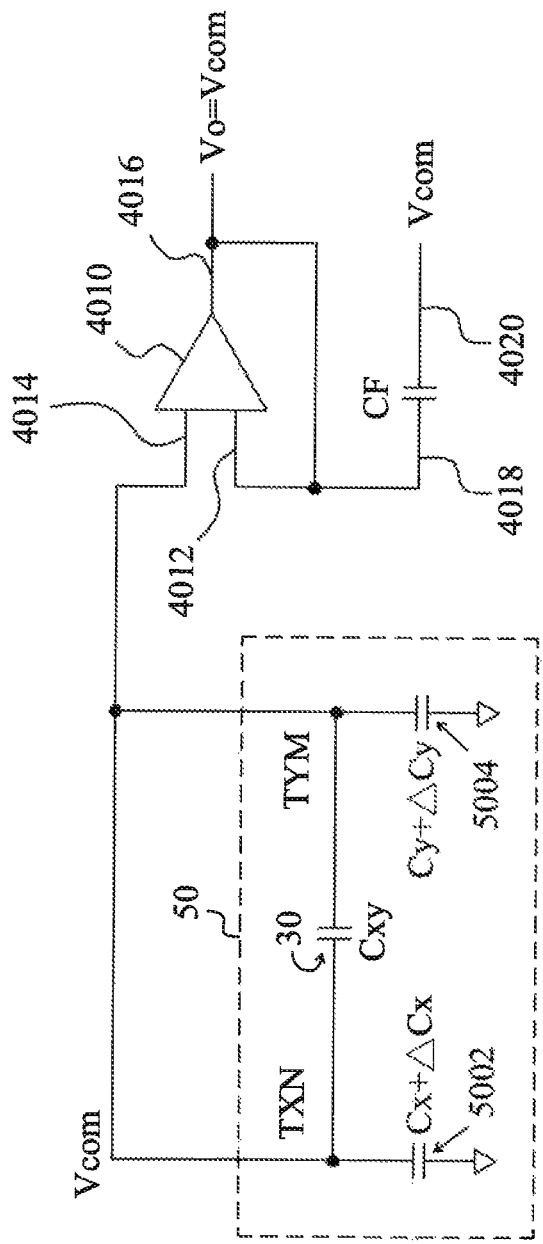
FIG. 10 is an equivalent circuit of FIG.) in a first clock phase.
Figure 11:
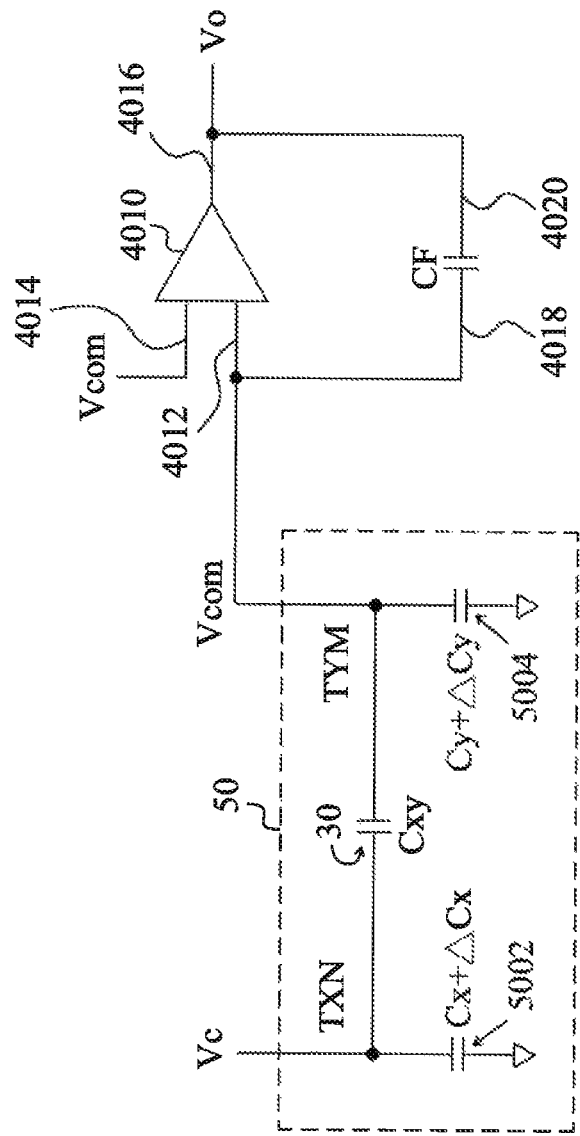
FIG. 11 is an equivalent circuit of FIG. 9 in a second clock phase.

FIG. 9 is a schematic diagram showing how a ghost point is sensed, in which the self capacitors 5002 and 5004 of the traces TXN and TYM have the capacitance increases ΔCx and ΔCy, respectively, but the lateral capacitor 30 has no increase in capacitance because the intersection of the traces TXN and TYM is not touched. FIGS. 10 and 11 are equivalent circuits of the sensing circuit 40 in the clock phases P1 and P2, respectively. In the clock phase P1, as shown in FIG. 10, the switches SW2, SW3, SW5 and SW6 are closed, and the switches SW1, SW4 and SW7 are opened. Hence, the traces TXN and TYM are both connected to the voltage terminal Vcom, and the second terminal 4020 of the sensing capacitor CF is connected to the voltage terminal Vcom, and the output 4016 and the input 4012 of the operational amplifier 4010 are connected together. Since the self capacitor 5002 of the trace TXN has the capacitance increase ΔCx, the charge thereof is expressed by the equation Eq-1. Similarly, as the self capacitor 5004 of the trace TYM has the capacitance increase ΔCy, the charge thereof is expressed by the equation Eq-2. On the other hand, the charge of the lateral capacitor 30 is zero because the two terminals of the lateral capacitor 30 are equal in voltage Due to virtual short circuit, the voltage at the input 4012 of the operational amplifier 4010 is equal to the voltage Vcom at the input 4014. As a result, the two terminals 4018 and 4020 of the sensing capacitor CF are equal in voltage, the charge of the sensing capacitor CF is zero, and the voltage Vo at the output 4016 of the operational amplifier 4010 is equal to Vcom. In the subsequent clock phase P2, referring to FIG. 11, the switches SW2, SW3, SW5 and SW6 are opened, and the switches SW1, SW4 and SW7 are closed. Thus, the trace TXN is connected to the voltage terminal Vc, the trace TYM is connected to the input 4012 of the operational amplifier 4010, and the second terminal 4020 of the sensing capacitor CF is connected to the output 4016 of the operational amplifier 4010, and the output 4016 and the input 4012 of the operational amplifier 4010 are disconnected from each other. Under this circumstance, the charge of the self capacitor 5002 of the trace TXN is expressed by the equation Eq-3, and the charge of the self capacitor 5004 of the trace TYM is expressed by the equation Eq-4. Since the TXN-side voltage of the lateral capacitor 30 has been switched from Vcom to Vc, and the TYM-side terminal of the lateral capacitor 30 is connected to the first terminal 4018 of the sensing capacitor CF, the charge of the lateral capacitor 30 is $$Qcxy = (Vc - Vcom) \times Cxy. \qquad [\text{Eq-8}]$$

Due to conservation of charge, the voltage at the second terminal 4020 of the sensing capacitor CF is changed. According to the equation Eq-8, the charge of the sensing capacitor CF is $$Qcf = (Vo - Vcom) \times C = -(Vc - Vcom) \times Cxy. \qquad [\text{Eq-9}]$$

Further, the voltage at the output 4016 of the operational amplifier 4010 is derived from the equation Eq-9 as $$Vo = (-Cxy/CF) \times (Vc - Vcom) + Vcom. \qquad [\text{Eq-10}]$$

Figure 12:
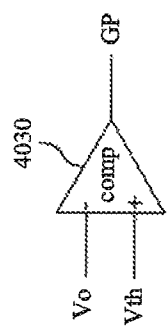
FIG. 12 is a circuit diagram of a first embodiment for a determination circuit.
Figure 13:
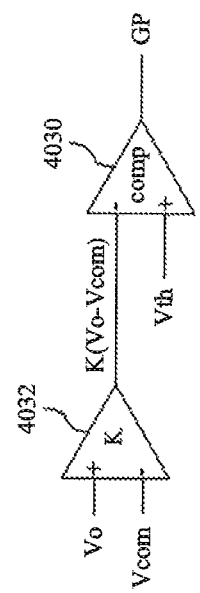
FIG. 13 is a circuit diagram of a second embodiment for a determination circuit.

It can be known from the equation Eq-10 that the capacitance variations ΔCx and ΔCy of the self capacitors 5002 and 5004 of the traces TXN and TYM do not affect the output Vo of the sensing circuit 40. Besides, a comparison between the equations Eq-7 and Eq-10 shows that, as the lateral capacitor 30 of a real point differs from that of a ghost point in capacitance values, the voltage Vo at the output 4016 of the operational amplifier 4010 varies accordingly. Hence, the magnitude of the voltage Vo can be used to determine whether the intersection of the traces TXN and TYM is touched by a finger. For example, now that the difference between the voltage Vo of a real point and that of a ghost point is ΔCxy(Vc−Vcom)/CF, if the voltage Vo of a point being detected exceeds a certain threshold value, it can be determined that the point in question is a real point. FIG. 12 is a circuit diagram of an embodiment for the determination circuit, in which a comparator 4030 compares the voltage Vo with a threshold voltage Vth in order to determine whether the intersection of the traces TXN and TYM is touched. For example, a ghost point is identified if the signal GP is logic high (1), and a real point is identified if the signal GP is logic low (0). The value of the threshold voltage Vth determines the sensitivity of the circuit toward the capacitance variation ΔCxy of the lateral capacitor 30. Viewing from another perspective, the relationship of Vo=Vcom exists in the first clock phase P1 regardless of whether the pointed being detected is a real point or a ghost point. In the second clock phase P2, however, the voltage Vo of a real point is different from that of a ghost point. Therefore, it is also feasible to distinguish a real point from a ghost point by the variation of Vo in the two clock phases P1 and P2. Referring to FIG. 13 for another embodiment of the determination circuit, a differential amplifier 4032 with an amplification coefficient K has two inputs for receiving the voltages Vo and Vcom, respectively, and an output from the differential amplifier 4032 is sent to a comparator 3030 along with the threshold voltage Vth. The point being detected is identified as a ghost point if the signal GP generated is logic high (1), and as a real point if the signal GP is logic low (0). The values of the amplification coefficient K and the threshold voltage Vth determine the sensitivity of the circuit toward the capacitance variation $\Delta Cxv$ of the lateral capacitor 30.

In the embodiments shown in FIGS. 6 through 11, a single sensing cycle includes two non-overlapping clock phases P1 and P2. The operation in the clock phase P1 involves resetting the voltages across the lateral capacitor 30 and across the sensing capacitor CF to zero such that the charges of the lateral capacitor 30 and of the sensing capacitor CF re zero. In another embodiment, however, the voltage across the lateral capacitor 30 can be set at a value other than zero in the clock phase P1. In the clock phase P2 that follows, the TXN-side voltage of the lateral capacitor 30 is changed, and due to conservation of charge, the voltage at the output Vo of the sensing circuit 40 is changed at the same time. Thus, the present status of the lateral capacitor 30 is reflected in real time at the output Vo of the sensing circuit 40, allowing the position of a real point to be determined accurately.

Figure 1:
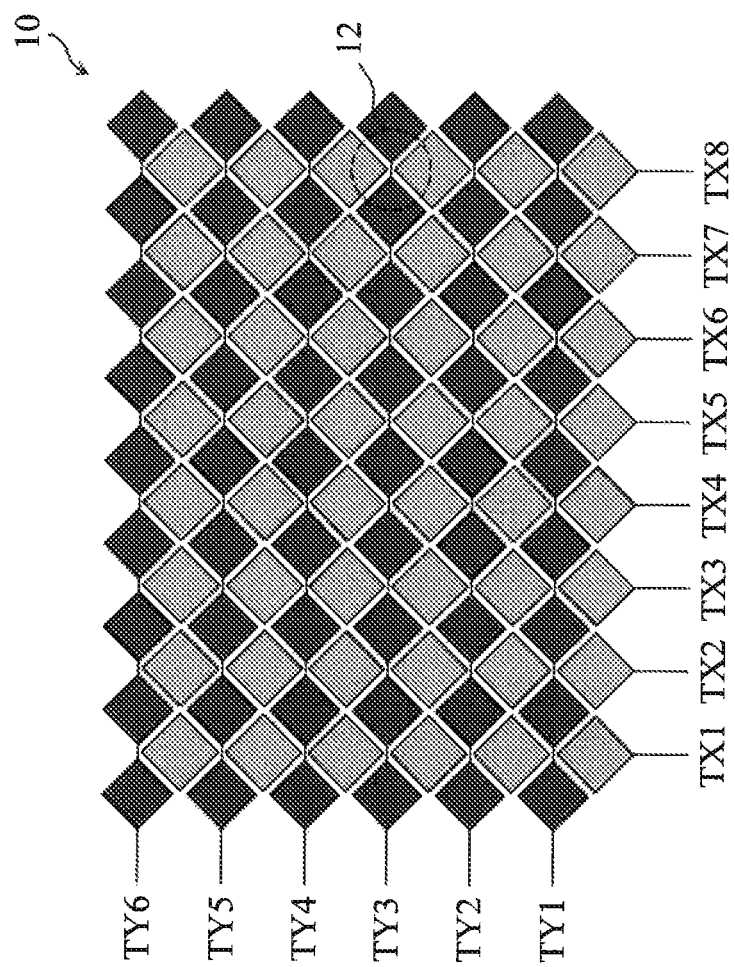
FIG. 1 is a schematic diagram showing a conventional capacitive touch panel.

When the sensing circuit 40 is applied to the capacitive touch panel 10 of FIG. 1, and the capacitive touch panel 10 is simultaneously touched by two fingers at the points 20 and 22 as shown in FIG. 2, the self capacitances of all the traces TX2, TX4, TY2, and TY4 are changed. However, since points 24 and 26 are not touched by the fingers, the intersection of the traces TX2 and TY2 shows no lateral capacitance variation, nor does the intersection of the traces TX4 and TY4. Hence, the possibility of the real points being located at the points 24 and 26 can be eliminated, thereby preventing the errors which may otherwise result from. the ghost points.

Figure 14:
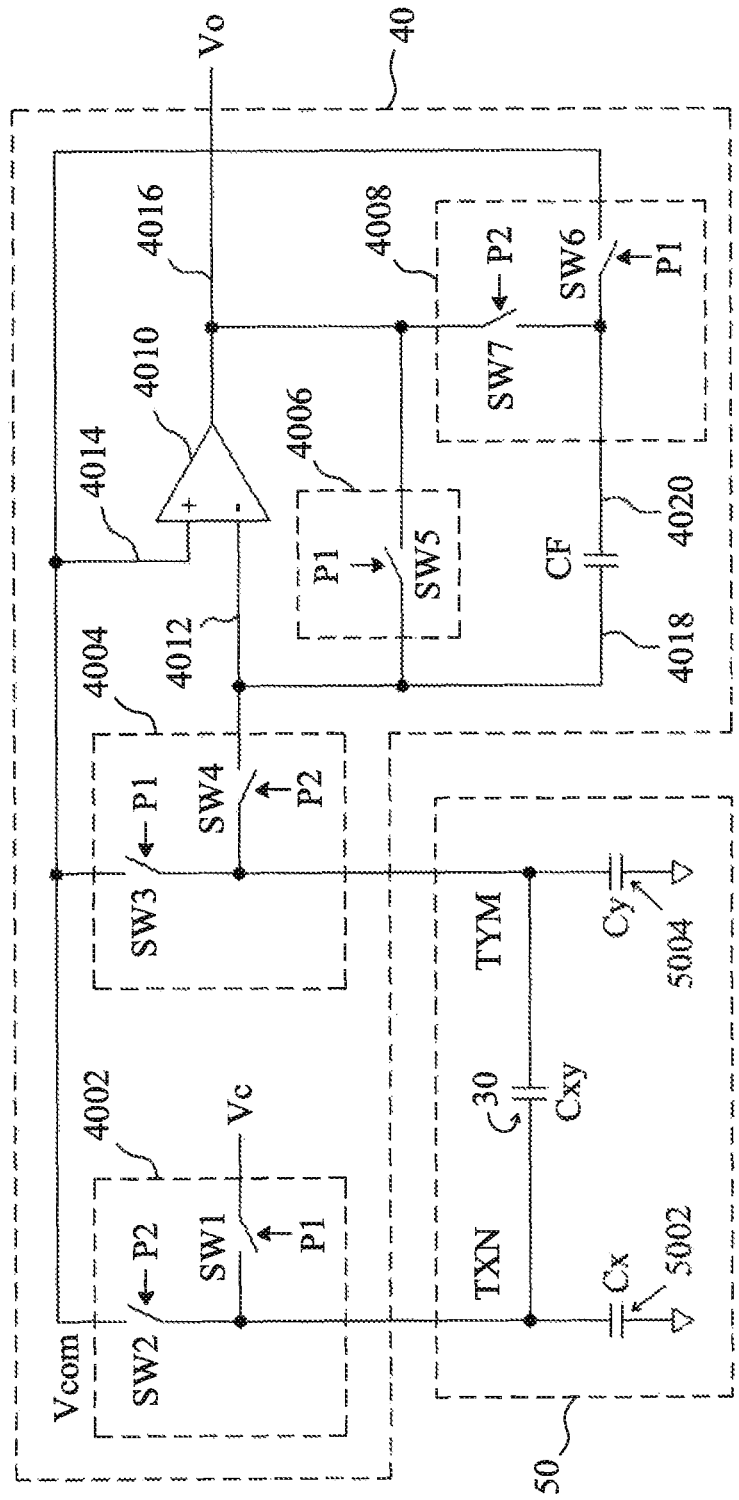
FIG. 14 is a circuit diagram of a second embodiment for a sensing circuit according to the present invention.

FIG. 14 is a circuit diagram of another embodiment for the sensing circuit 40. The traces TXN and TYM of FIG. 3 are depicted in FIG. 14 as an equivalent circuit 50, in which the trace TXN has a self capacitor 5002 with a capacitance value Cx, the trace TYM has a self capacitor 5004 with a capacitance value Cy, and the lateral capacitor 30 between the traces TXN and TYM has a capacitance value Cxy. In the sensing circuit 40, a switching circuit 4002 includes a switch SW1 connected between a voltage terminal Vc and the trace TXN, and a switch SW2 connected between the trace TXN and a voltage terminal Vcom, and the switches SW1 and SW2 are controlled by the clock phases P1 and P2, respectively. A switching circuit 4004 includes a switch SW3 connected between the trace TYM and the voltage terminal Vcom, and a switch SW4 connected between the trace TYM and an input 4012 of an operational amplifier 4010, and the switches SW3 and SW4 are controlled by the clock phases P1 and P2, respectively. The operational amplifier 4010 has another input 4014 connected to the voltage terminal Vcom. A switching circuit 4006 includes a switch SW5 connected between the input 4012 and an output 4016 of the operational amplifier 4010 and controlled by the clock phase P1. A sensing capacitor CF has a first terminal 4018 and a second terminal 4020, of which the first terminal 4018 is connected to the input 4012 of the operational amplifier 4010, and the second terminal 4020 is connected to a switching circuit 4008. The switching circuit 4008 includes a switch SW6 connected between the second terminal 4020 of the sensing capacitor CF and the voltage terminal Vcom, and a switch SW7 connected between the second terminal 4020 of the sensing capacitor CF and the output 4016 of the operational amplifier 4010, of which the switches SW6 and SW7 are controlled by the clock phases P1 and P2, respectively.

Figure 15:
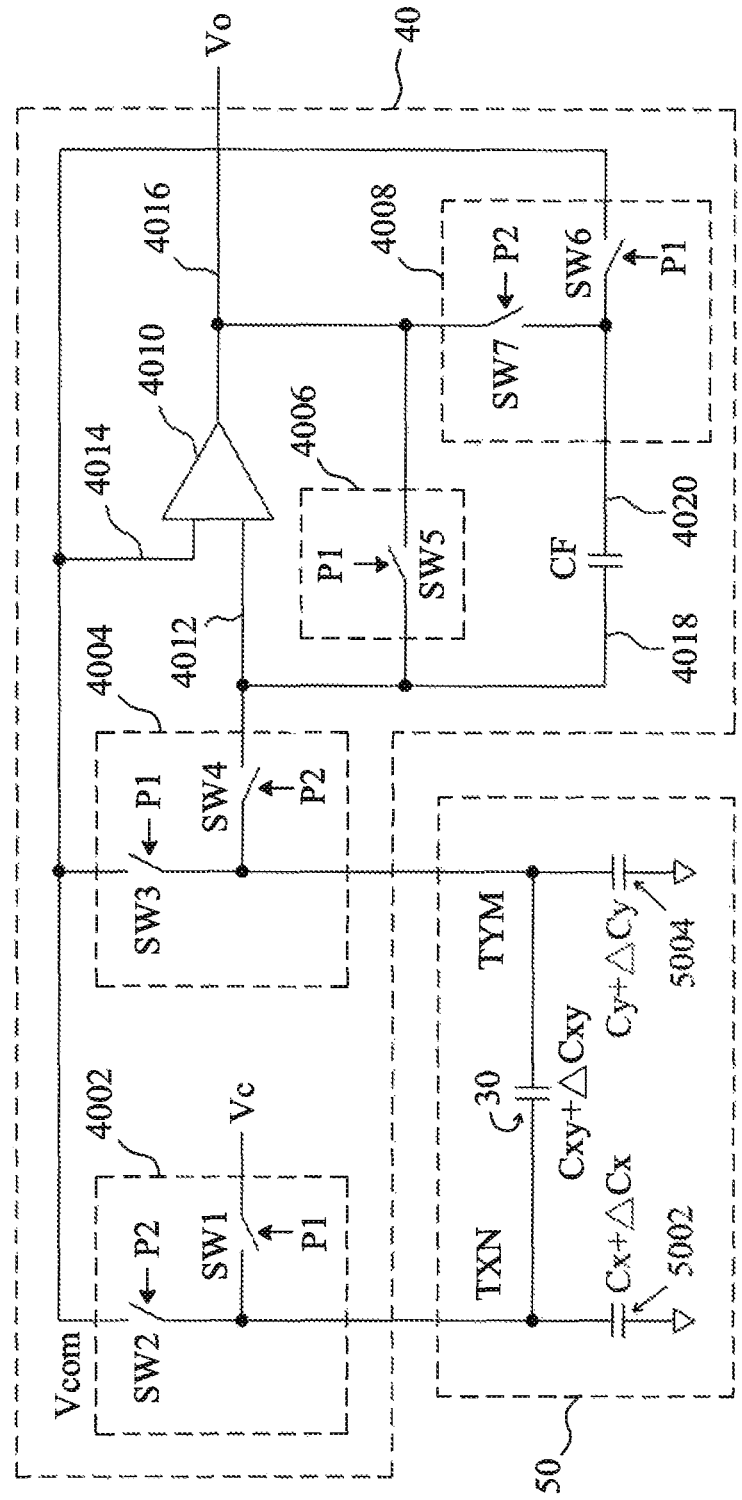
FIG. 15 is a circuit diagram of FIG. 14 when sensing a real point.
Figure 16:
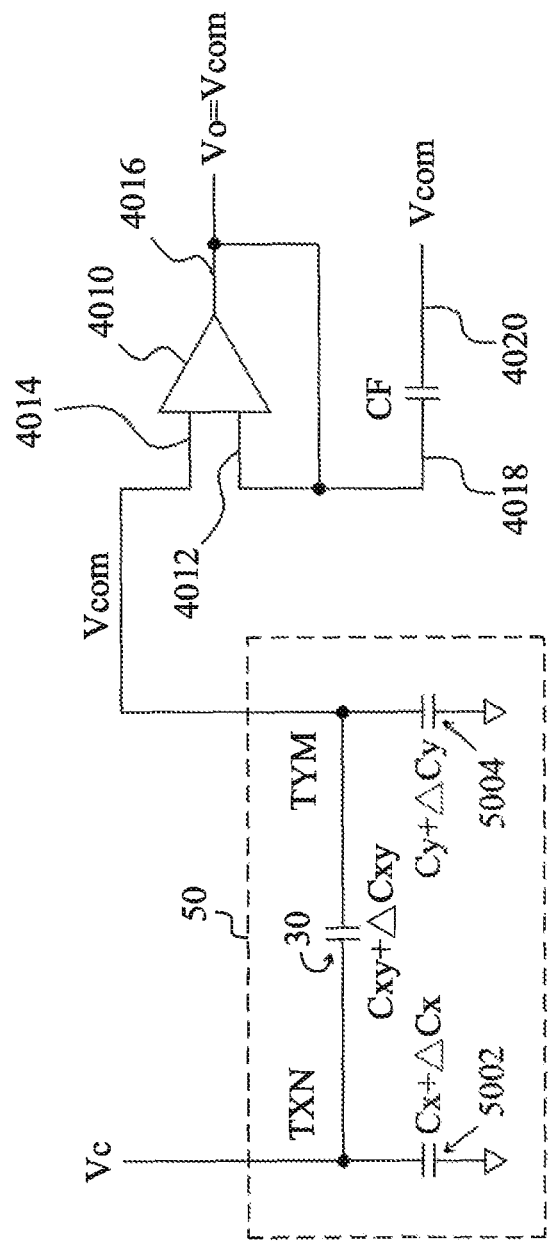
FIG. 16 is an equivalent circuit of FIG. 15 in a first clock phase.
Figure 17:
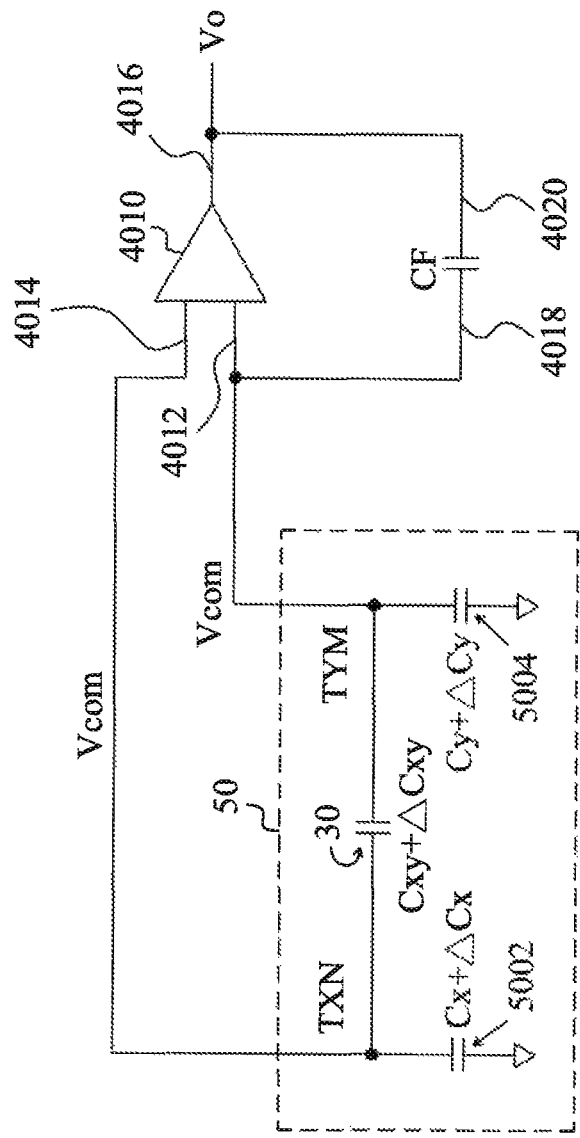
FIG. 17 is an equivalent circuit of FIG. 15 in a second clock phase.

FIG. 15 is the circuit diagram of FIG. 14 when a finger touches the intersection of the traces TXN and TYM, in which the self capacitors 5002 and 5004 of the traces TXN and TYM have increases in capacitance $\Delta Cx$ and $\Delta Cy$, respectively, and the lateral capacitor 30 has an increase in capacitance $\Delta Cxy$. FIGS. 16 and 17 are equivalent circuits of the sensing circuit 40 depicted in FIG. 15 in the clock phases P1 and P2, respectively. Referring to FIG. 16, in the clock phase P1, the switches SW1, SW3, SW5 and SW6 are closed, and the switches SW2, SW4, and SW7 are opened. Consequently, the trace TXN is connected to the voltage terminal Vc, the trace TYM is connected to the voltage terminal Vcom, and the second terminal 4020 of the sensing capacitor CF is connected to the voltage terminal Vcom, while the output 4016 and the input 4012 of the operational amplifier 4010 are connected together. Since the self capacitor 5002 of the trace TXN has the capacitance increase $\Delta Cx$, the charge thereof is $$Qcx=Vc\times(Cx+\Delta Cx).\qquad\text{[Eq-11]}$$

Similarly, as the self capacitor 5004 of the trace TYM has the capacitance increase $\Delta Cy$, the charge thereof is $$Qcy=Vcom\times(Cy+\Delta Cy).\qquad\text{[Eq-12]}$$

By the same token, the charge of the lateral capacitor 30 is $$Qcxy=(Vc-Vcom)\times(Cxy+\Delta Cxy).\qquad\text{[Eq-13]}$$

Due to virtual short circuit, the voltage at the input 4012 of the operational amplifier 4010 is equal to the voltage Vcom at the input 4014, Therefore, the terminals 4018 and 4020 of the sensing capacitor CF are equal in voltage, and the charge of the sensing capacitor CF is zero. Meanwhile, the voltage Vo at the output 4016 of the operational amplifier 4010 is equal to Vcom. In the subsequent clock phase P2, as shown in FIG. 17, the switches SW1, SW3, SW5 and SW6 are opened, and the switches SW2, SW4 and SW7 are closed. In consequence, the trace TXN is connected to the voltage terminal Vcom, the trace TYM is connected to the input 4012 of the operational amplifier 4010, and the second terminal 4020 of the sensing capacitor CF is connected to the output 4016 of the operational amplifier 4010. Meanwhile, the output 4016 and the input 4012 of the operational amplifier 4010 are disconnected from each other. Under this circumstance, the charge of the self capacitor 5002 of the trace TXN is $$Qcx=Vcom\times(Cx+\Delta Cx),\qquad\text{[Eq-14]}$$

and the charge of the self capacitor 5004 of the trace TYM is $$Qcy=Vcom\times(Cy+\Delta Cy).\qquad\text{[Eq-15]}$$

Now that the two terminals of the lateral capacitor 30 are equal in voltage, the charge of the lateral capacitor 30 is zero. Due to conservation of charge, the voltage at the second terminal 4020 of the sensing capacitor CF is changed. According to the equation Eq-13, the charge of the sensing capacitor CF is $$Ocf=(Vo-Vcom)\times CF=(Vc-Vcom)\times(Cxy+\Delta Cxy).\qquad\text{[Eq-16]}$$

From the equation Eq-16, the voltage at the output 4016 of the operational amplifier 4010 is derived as $$Vo=[(Cxy+\Delta Cxy)/CF]\times(Vc-Vcom)+Vcom.\qquad\text{[Eq-17]}$$

It can be known from the equation Eq. 17 that the capacitance variations ΔCx and ΔCy of the self capacitors 5002 and 5004 of the traces TXN and TYM do not affect the output Vo of the sensing circuit 40.

Figure 18:
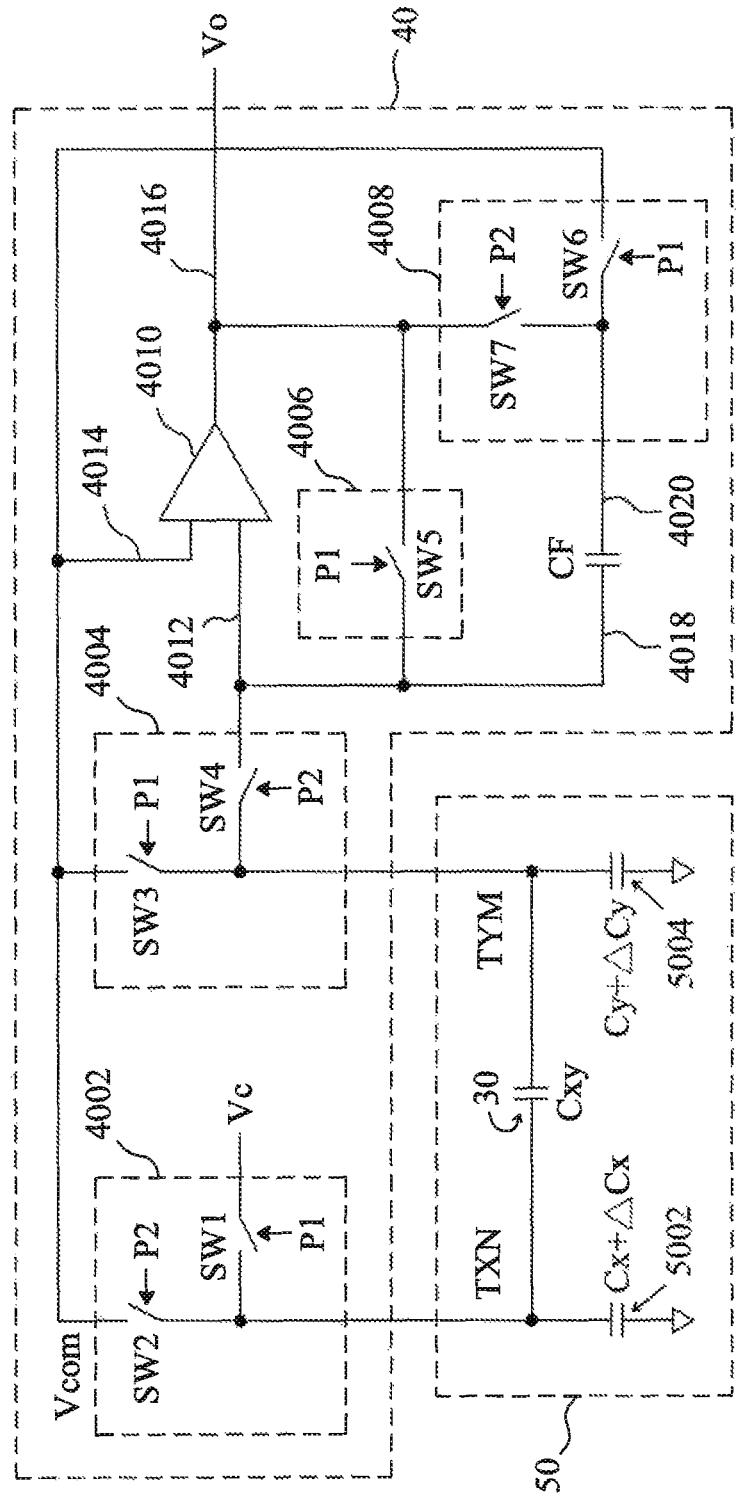
FIG. 18 is a circuit diagram of FIG. 14 when sensing a ghost point.
Figure 19:
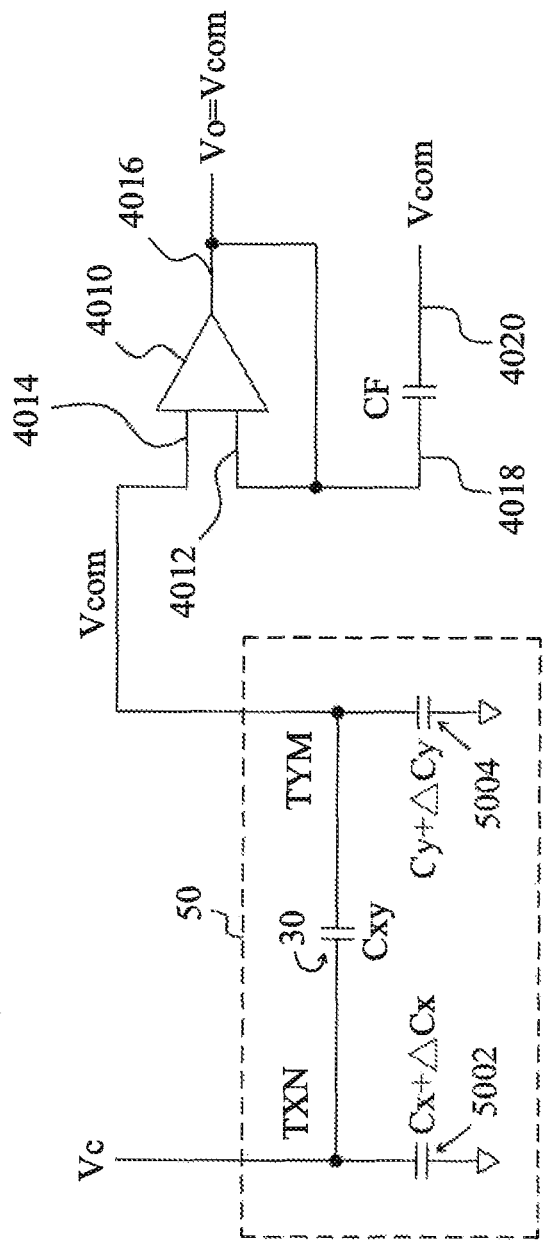
FIG. 19 is an equivalent circuit of FIG. 1$ in a first clock phase.
Figure 20:
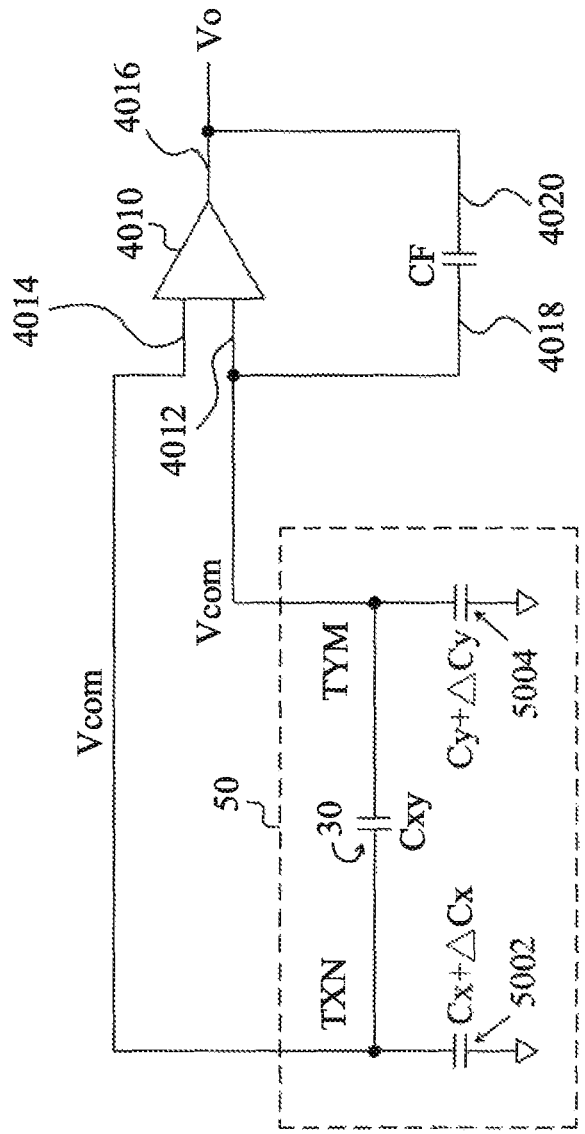
FIG. 20 is an equivalent circuit of FIG. 18 in a second clock phase.

FIG. 18 is the circuit diagram of FIG. 14 when sensing a ghost point. While the self capacitors 5002 and 5004 of the traces TXN and TYM have the capacitance increases ΔCx and ΔCy, respectively, the lateral capacitor 30 has no capacitance increase because the intersection of the traces TXN and TYM is not touched. FIGS. 19 and 20 are equivalent circuits of the sensing circuit 40 depicted in FIG. 18 in the clock phases P1 and P2, respectively. In the clock phase P1, as shown in FIG. 19, the switches SW1, SW3, SW5 and SW6 are closed, and the switches SW2, SW4 and SW7 are opened. Hence, the trace TXN is connected to the voltage terminal Vc, the trace TYM is connected to the voltage terminal Vcom, and the second terminal 4020 of the sensing capacitor CF is connected to the voltage terminal Vcom, while the output 4016 and the input 4012 of the operational amplifier 4010 are connected together. Since the self capacitor 5002 of the trace TXN has the capacitance increase ΔCx, the charge thereof is expressed by the equation Eq-11. Similarly, as the self capacitor 5004 of the trace TYM has the capacitance increase ΔCy, the charge thereof is expressed by the equation Eq-12. On the other hand, the charge of the lateral capacitor 30 is $$Qcxy=(Vc-Vcom)\times Cxy. \quad [\text{Eq-18}]$$

Due to virtual short circuit, the voltage at the input 4012 of the operational amplifier 4010 is equal to the voltage Vcom at the input 4014. As a result, the two terminals 4018 and 4020 of the sensing capacitor CF are equal in voltage, and therefore the charge of the sensing capacitor CF is zero. Meanwhile, the voltage Vo at the output 4016 of the operational amplifier 4010 is equal to Vcom. In the subsequent clock phase P2, referring to FIG. 20, the switches SW1, SW3, SW5 and SW6 are opened, and the switches SW2, SW4 and SW7 are closed. Therefore, the trace TXN is connected to the voltage terminal Vcom, the trace TYM is connected to the input 4012 of the operational amplifier 4010, and the second terminal 4020 of the sensing capacitor CF is connected to the output 4016 of the operational amplifier 4010, while the output 4016 and the input 4012 of the operational amplifier 4010 are disconnected from each other. Under this circumstance, the charge of the self capacitor 5002 of the trace TXN is expressed b the equation Eq-14, and the charge of the self capacitor 5004 of the trace TYM is expressed by the equation Eq-15. Since the two terminals of the lateral capacitor 30 are equal in voltage., the charge of the lateral capacitor 30 is zero, and due to conservation of charge, the voltage at the second terminal 4020 of the sensing capacitor CF is changed. According to the equation Eq-18, the charge of the sensing capacitor CF is $$Qcf=(Vo-Vcom)\times CF=(Vc-Vcom)\times Cxy. \quad [\text{Eq-19}]$$

From the equation Eq-19, the voltage at the output 4016 of the operational amplifier 4010 is obtained as $$Vo=(Cxy/CF)\times(Vc-Vcom)+Vcom. \quad [\text{Eq-20}]$$

It can be known from the equations Eq-17 and Eq-20 that, as the lateral capacitor 30 of a real point differs from that of a ghost point in capacitance value, the voltage Vo at the output 4016 of the operational amplifier 4010 varies accordingly. Hence, the magnitude of the voltage Vo can be used to determine whether the intersection of the traces TXN and TYM is touched by a finger.

While the present invention has been described in conjunction with preferred embodiment thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A sensing method for a capacitive touch panel including a first trace, a second trace, and a lateral capacitor formed at an intersection of the first trace and the second trace, the sensing method comprising:
    (a) in a first clock phase, applying a first voltage to the first trace and the second trace and setting a voltage across a sensing capacitor, wherein during the first clock phase, the first trace is always set to the first voltage; and
    (b) in a second clock phase, switching the first trace being connected from the first voltage to a second voltage and connecting the second trace to a first terminal of the sensing capacitor to thereby cause a voltage variation at a second terminal of the sensing capacitor;
    wherein the second terminal of the sensing capacitor is connected to a first input terminal of an operational amplifier and the first terminal of the sensing capacitor is connected to a second input terminal of the operational amplifier during the first clock phase; and
    wherein the first terminal of the sensing capacitor is connected to both the second input terminal of the operational amplifier and the second trace, and the second terminal of the sensing capacitor is connected to an output terminal of the operational amplifier during the second clock phase.

2. The sensing method of claim 1, wherein the step a comprise applying the third voltage to the first terminal and the second terminal of the sensing capacitor.

3. The sensing method of claim 2, wherein the third voltage is equal to the first voltage.

4. The sensing method of claim 2, wherein the third voltage is different from the first voltage and the second voltage.

5. The sensing method of claim 1, wherein the step b comprises:
    applying the first voltage to a first input of the operational amplifier;
    connecting the second trace as well as the first terminal of the sensing capacitor to a second input of the operational amplifier; and
    connecting the second terminal of the sensing capacitor to the output of the operational amplifier.

6. The sensing method of claim 1, further comprising determining whether the intersection is touched according to the voltage variation at the second terminal of the sensing capacitor.

7. A sensing circuit for a capacitive touch panel including a first trace, a second trace, and a lateral capacitor formed at an intersection of the first trace and the second trace, the sensing circuit comprising:
    a first switching circuit connected to the first trace to connect the first trace to a first voltage terminal in a first clock phase and to a second voltage terminal in a second clock phase;
    an operational amplifier having a first input connected to the first voltage terminal, a second input, and an output;
    a second switching circuit connected to the second trace to connect the second trace to the first voltage terminal in the first clock phase and to the second input of the operational amplifier in the second clock phase;
    a sensing capacitor having a first terminal connected to the second input of the operational amplifier, and a second terminal;

a third switching circuit connected between the second input and the output of the operational amplifier to connect the output of the operational amplifier to the second input in the first clock phase; and a fourth switching circuit connected to the second terminal of the sensing capacitor to connect the second terminal of the sensing capacitor to the first input of the operational amplifier in the first clock phase and to the output of the operational amplifier in the second clock phase;

wherein the fourth switching circuit comprises:

a first switch for connecting the second terminal of the sensing capacitor to the first input of the operational amplifier in the first clock phase; and a second switch for connecting the second terminal of the sensing capacitor to the output of the operational amplifier in the second clock phase;

wherein the first terminal of the sensing capacitor is connected to the second input of the operational amplifier and the second terminal of the sensing capacitor is connected to the first input of the operational amplifier during the first clock phase; and wherein the first terminal of the sensing capacitor is connected to both the second input of the operation amplifier and the second trace, and the second terminal of the sensing capacitor is connected to the output of the operational amplifier during the second clock phase.

8. The sensing circuit of claim 7 wherein the first switching circuit comprises:

a third switch connected between the first trace and the second voltage terminal; and a fourth switch connected between the first trace and the first voltage terminal.

9. The sensing circuit of claim 7, wherein the second switching circuit comprises:

a third switch connected between the second trace and the first voltage terminal; and a fourth switch connected between the second trace and the. second input of the operational amplifier.

10. The sensing circuit of claim 7, wherein the third switching circuit comprises a switch connected between the second input and the output of the operational amplifier.

11. The sensing circuit of claim 7, further comprising a comparator connected to the output of the operational amplifier to compare the voltage at the output with a threshold value in the second clock phase, so as to determine whether the intersection is touched.

12. The sensing circuit of claim 7, further comprising:

a differential amplifier connected to the first voltage terminal and the output of the operational amplifier to amplify a voltage difference therebetween; and a comparator connected to the differential amplifier to compare the amplified voltage difference with a threshold value in the second clock phase, so as to determine whether the intersection is touched.

13. The sensing circuit according to claim 7, wherein during the first clock phase, the first trace is always connected to the first voltage terminal.

\* \* \* \* \*